United States Patent [19]
Wen

[11] Patent Number: 5,950,089
[45] Date of Patent: Sep. 7, 1999

[54] METHOD OF MAKING READ-ONLY MEMORY DEVICE HAVING A SILICON-ON-INSULATOR STRUCTURE

[75] Inventor: Jemmy Wen, Hsinchu, Taiwan

[73] Assignee: United Microelectronics Corp., Taiwan

[21] Appl. No.: 08/847,521

[22] Filed: Apr. 22, 1997

[30] Foreign Application Priority Data

Mar. 25, 1997 [TW] Taiwan .................................. 86103800

[51] Int. Cl.$^6$ .............................................. H01L 21/8234
[52] U.S. Cl. ............................................ 438/275; 438/277
[58] Field of Search .................................... 438/257, 275, 438/276, 277, 278

[56] References Cited

U.S. PATENT DOCUMENTS

| | | | |
|---|---|---|---|
| 5,264,386 | 11/1993 | Yang | 437/52 |
| 5,736,444 | 4/1998 | Kauffman et al. | 438/257 |
| 5,807,778 | 9/1998 | Lee | 438/257 |

Primary Examiner—Joni Chang
Attorney, Agent, or Firm—Finnegan, Henderson, Farabow, Garrett & Dunner, L.L.P.

[57] ABSTRACT

A semiconductor read-only memory (ROM) device having a silicon-on-insulator (SOI) structure and a method for fabricating the same are provided. The SOI structure permits isolation of the source/drain regions from the underlying substrate, thereby preventing leakage current therebetween. The ROM device of the present invention is smaller than conventional ROM devices, and thus provides increased integration without generating leakage paths due to misalignment of the contact windows used to form metal interconnects. The ROM device includes a plurality of parallel gate regions and a grid-like polysilicon conductive layer. The grid-like structure includes a plurality of substantially parallel source/drain regions on both sides of the gate regions, and a plurality of substantially parallel channel regions crossing the source/drain regions and the gate regions at right angles. Select locations of the channel regions are impurity-doped, causing the associated memory cells to be set to a permanently-OFF state. Whereas, the undoped channel regions are associated with memory cells to be set to a permanently-ON state.

15 Claims, 6 Drawing Sheets

METHOD OF MAKING READ-ONLY MEMORY DEVICE HAVING A SILICON-ON-INSULATOR STRUCTURE

BACKGROUND OF THE INVENTION

1. Field of the Invention

The present invention relates generally to semiconductor memory devices, and more particularly, to a method for making a semiconductor read-only memory (ROM) device comprising an array of thin-film metal-oxide semiconductor field-effect transistor (MOSFET) memory cells having a silicon-on-insulator (SOI) structure.

2. Description of Related Art

Read-only memory (ROM) is a nonvolatile semiconductor memory widely used in computer and microprocessor systems for permanently storing programs and data that are repeatedly used, such as the BIOS (Basic Input/Output System, used in operating systems of personal computers). Manufacturing ROMs involves very complicated and time-consuming processes requiring costly equipment and material. Therefore, customers typically first define the data to be permanently stored in ROMs, and then provide the data to the ROM manufacturer for programming into the ROMs.

Most ROMs have identical semiconductor structures except for the data stored therein. Thus, ROM devices are typically prefabricated up to the programming stage and then stored as semi-finished products in inventories waiting for customer orders. When the customer furnishes the data, the ROM manufacturer stores the data into the semi-finished ROMs using a mask programming process. This is now the standard method in the semiconductor industry used for ROM fabrication.

In most conventional ROMs, MOSFETs are used as the memory cells for data storage. In the mask programming stage, impurities are selectively doped into specified channels of the MOSFET memory cells so to change the threshold voltage thereof and to set the MOSFET memory cells to ON/OFF states representing the storage of different binary data. The MOSFET memory cells connect to external circuits via a plurality of polysilicon-based word lines, wherein channel regions are located beneath the word lines and between each pair of adjacent bit lines. Whether a MOSFET memory cell is set to store a binary digit of "0" or "1" depends upon whether the associated channel is doped with impurities or not. If a channel is doped with impurities, the MOSFET memory cell is set to a low threshold voltage, which effectively sets the MOSFET memory cell to a permanently-ON state representing the storage of a first binary digit, such as, for example "0." Otherwise, the MOSFET memory cell is set to a high threshold voltage, which effectively sets the MOSFET memory cell to a permanently-OFF state representing the storage of a second binary digit, such as, for example "1."

A conventional MOSFET-based ROM device is shown in FIGS. 1A–1C, wherein FIG. 1A is a top view of the ROM device; FIG. 1B is a cross-sectional view of the ROM device of FIG. 1A taken along line I–I'; and FIG. 1C is a cross-sectional view of the ROM device of FIG. 1A taken along line II–II'.

As shown, the conventional ROM device includes a semiconductor substrate 10, such as a P-type silicon substrate, on which a plurality of parallel-spaced bit lines 11 and a plurality of parallel-spaced word lines 13, crossing bit lines 11, are formed. Word lines 13 are isolated from the underlying bit lines 11 using an oxidation layer 12. The conventional ROM device also includes a plurality of MOSFET memory cells, wherein each MOSFET memory cell is associated with one segment of word lines 13 between each neighboring pair of bit lines 11.

In the method for fabricating the conventional ROM device, as shown in FIG. 1C, an ion implantation process dopes an N-type impurity material, such as arsenic (As), into selected regions of substrate 10 to form a plurality of parallel-spaced diffusion regions serving as bit lines 11. The interval region between each neighboring pair of bit lines 11 serves as a channel region 16. Subsequently, a thermal oxidation process forms oxidation layer 12 over the entire top surface of the device. Next, a conductive layer, such as a highly-doped polysilicon layer, is formed over the device, and is then selectively removed through a photolithographic and etching process. The remaining portions of the conductive layer serve as word lines 13.

Upon receipt of a customer order supplying binary data, a mask programming process permanently writes the binary data into the ROM device. In the mask programming process, a mask 15 is placed over the device, wherein mask 15 is predefined to form a plurality of openings according to the bit pattern of the binary data to be written into the ROM device. The plurality of openings expose channel regions of a first selected group of MOSFET memory cells, wherein the exposed channel regions are set to a permanently-ON state. By contrast, the unexposed channel regions of a second group of the MOSFET memory cells are set to a permanently-OFF state. Subsequently, an ion implantation dopes a P-type impurity material, such as boron, into the exposed channel regions.

In the finished ROM device, the doped channel regions cause the associated MOSFET memory cells to have a low threshold voltage, and thus, sets the MOSFET memory cells to a permanently-ON state representing the permanent storage of a first binary digit, such as "0." On the other hand, the undoped channel regions cause the associated MOSFET memory cells to have a high threshold voltage, and thus, sets the MOSFET memory cells to a permanently-OFF state representing the permanent storage of a second binary digit, such as "1."

Another conventional ROM device is shown in FIGS. 2A and 2B, wherein FIG. 2A is a top view of the ROM device, and FIG. 2B is a cross-sectional view of the ROM device of FIG. 2A taken along line III–III'.

As shown in FIG. 2A, the ROM device comprises a plurality of word lines WL1, WL2, WL3 and a plurality of bit lines BL1, BL2, BL3, wherein word lines WL1, WL2, WL3 each comprise a highly-doped polysilicon layer 23 serving as a gate region for the memory cells of the ROM device. Square boxes, as indicated by reference numeral 21, that are formed in an array between the word lines represent a plurality of source/drain regions.

Referring to FIG. 2B, in the method for fabricating the conventional ROM device, an ion implantation process dopes an N-type impurity material, such as arsenic (As), into selected areas of a substrate 20 so to form a plurality of parallel N+ source/drain regions 21 in substrate 20. The undoped regions between N+ source/drain regions 21 serve as channel regions 25. Subsequently, a select number of locations of channel regions 25 associated with the ON-state memory cells of the ROM device are doped with a P-type impurity material, such as boron (B). By contrast, the undoped channel regions are associated with the OFF-state memory cells. In a subsequent step, a plurality of oxide layers 22 are formed over respective channel regions 25, and a plurality of gate layers 23 are formed over respective oxide layers 22. N+ source/drain regions 21 and gate layers 23 together comprise a base for forming an array of MOSFET memory cells thereon. A mask insulating layer 27 is subsequently formed over the entire top surface of the device and selectively is removed to form a plurality of contact windows 28 exposing N+ source/drain regions 21. A metal, such as aluminum, is filled into the contact windows 28 to form a plurality of metal plugs 26 for electrically connecting N+ source/drain regions 21 to the word lines (not shown) to be formed on metal plugs 26.

One problem with the foregoing conventional methods for making ROMs is that the mask programming process must be conducted before the fabrication of the MOSFET memory cells are complete. In other words, there are still several processes required to complete the ROM device even after a customer order is received. Consequently, the time required to complete the mask programming process and the subsequent processes is quite lengthy. This lengthens the delivery time for the ROM device and makes the ROM device produced this way less competitive in the market.

Furthermore, leakage current occurs between source/drain regions 21 and substrate 20 in the conventional ROMs, since source/drain regions are formed in substrate 20. Still another problem of conventional ROMs is that, since contact windows 28 are formed above N+ source/drain regions 21, a large area is required for formation of N+ source/drain regions 21, resulting is a ROM device that can not be made smaller for increased integration.

SUMMARY OF THE INVENTION

It is an object of the present invention to provide a method for making a ROM device that prevents leakage current at the junction between the source/drain regions and the substrate. It is another object of the present invention to provide a method for making a ROM device that can be made smaller for increased integration, without causing leakage paths in the ROM device due to misalignment of contact windows used to form metal interconnects.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a method for making a ROM device having an array of MOSFET memory, comprising the steps of: forming a first insulating layer over a substrate; forming a first conductive layer over the first insulating layer; removing selected portions of the first conductive layer to form a plurality of substantially parallel gate regions in a first direction; forming a plurality of sidewall spacers, each of the sidewall spacers being formed on one sidewall of each of the gate regions; forming a second insulating layer covering exposed surfaces of the gate regions, the sidewall spacers, and the first insulating layer; forming a second conductive layer from polysilicon over the second insulating layer; conducting a thermal anneal process to cause the polysilicon of the second conductive layer to undergo grain growth; conducting an ion implantation process to dope an impurity material into the polysilicon of the second conductive layer, adjusting the threshold voltage thereof; removing selected portions of the second conductive layer to form a grid-like structure including a plurality of substantially parallel source/drain regions in the first direction on both sides of the gate regions, and a plurality of substantially parallel channel regions in a second direction, wherein the gate regions, the source/drain regions and the channel regions together comprise a base on which an array of memory cells are defined; conducting an ion implantation process to dope an impurity material of a first semiconductor type into the source/drain regions; and conducting a mask programming process.

The mask programming process comprises the steps of: preparing a mask for exposing select channel regions associated with a first selected group of the memory cells of the ROM device set to a permanently-OFF state, wherein the unexposed group of the channel regions are associated with a second selected group of the memory cells set to a permanently-ON state, and conducting an ion implantation process to dope an impurity material of a second semiconductor type into the exposed group of the channel regions.

The method of the present invention further comprises the steps of forming a third insulating layer over the memory cells; forming a plurality of source/drain contact windows and a plurality of gate contact windows in the third insulating layer; and filling a conductive material into the source/drain contact windows and the gate contact windows to form a plurality of gate electrodes in the gate contact windows and a plurality of source/drain electrodes in the source/drain contact windows.

In accordance with another aspect, the present invention comprises a ROM device comprising: a semiconductor substrate; a first insulating layer formed over said substrate; a plurality of substantially parallel gate regions formed over the first insulating layer in a first direction; a plurality of sidewall spacers, each sidewall spacer being formed on a sidewall of each of the gate regions; a second insulating layer formed over the gate regions, the sidewall spacers, and the first insulating layer; and a grid-like polysilicon conductive layer formed over the second insulating layer.

The grid-like polysilicon conductive layer includes a plurality of substantially parallel source/drain regions arranged in the first direction on both sides of the gate regions, and a plurality of substantially parallel channel regions arranged in a second direction and crossing the gate regions, wherein the gate regions, the source/drain regions, and the channel regions together comprise a base on which an array of memory cells are formed, including a first group of memory cells set to a permanently-OFF state and a second group of memory cells set to a permanently-ON state, the first group of memory cells being associated with locations on the channel regions that are doped with impurities.

The ROM device further comprises a third insulating layer formed over the memory cells, the third insulating layer being formed with a plurality of gate contact windows and a plurality of source/drain contact windows; a plurality of gate electrodes formed in the gate contact windows of the third insulating layer; and a plurality of source/drain electrodes formed in the source/drain contact windows of the third insulating layer.

It is to be understood that both the foregoing general description and the following detailed description are exemplary and explanatory only and are not restrictive of the invention, as claimed.

BRIEF DESCRIPTION OF DRAWINGS

The accompanying drawings, which are incorporated in and constitute a part of this specification, illustrate one embodiment of the present invention and together with the description, serve to explain the principles of the invention. In the drawings.

DETAILED DESCRIPTION OF PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

This present invention provides a ROM device and a method for making the ROM device having a silicon-on-insulator (SOI) structure. The SOI structure is made by forming an insulating layer on a silicon substrate. However, various other SOI structures may be used which are apparent to those skilled in the art of semiconductor technology.

FIGS. 3A–3F are cross-sectional views showing the steps of the method for making the ROM device having an array of thin-film MOSFET memory cells constructed with a silicon-on-insulator (SOI) structure, in accordance to a preferred embodiment of the present invention.

Figure 1A:
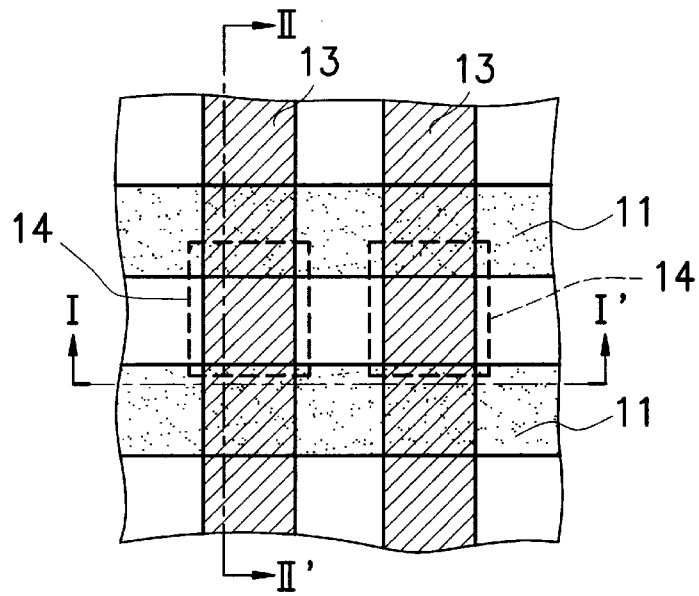
FIG. 1A is a top view of a conventional ROM device.
Figure 1B:
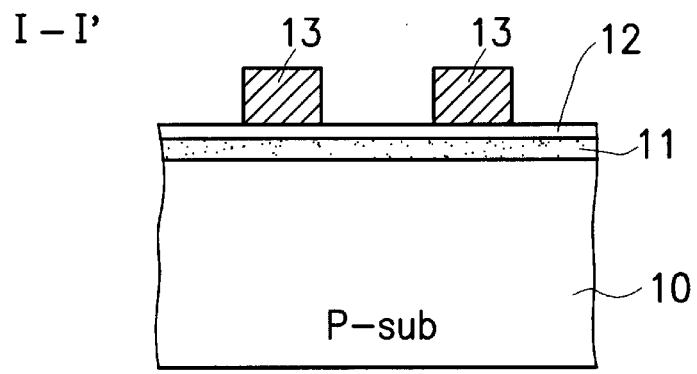
FIG. 1B is a cross-sectional view of the conventional ROM device of FIG. 1A taken along line I–I'.
Figure 1C:
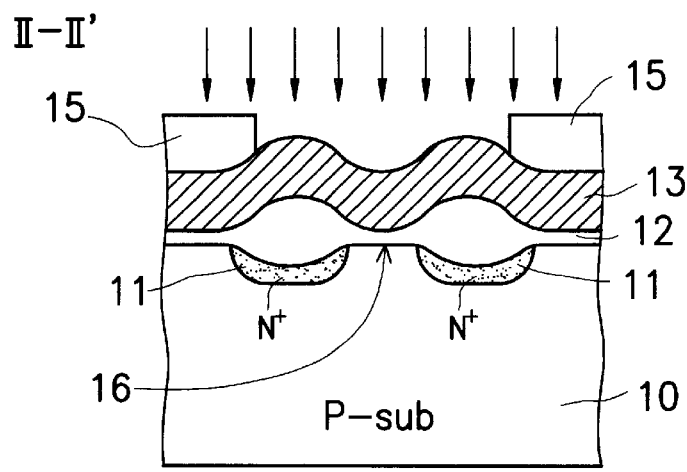
FIG. 1C is a cross-sectional view of the conventional ROM device of FIG. 1A taken along line II–II'.
Figure 2A:
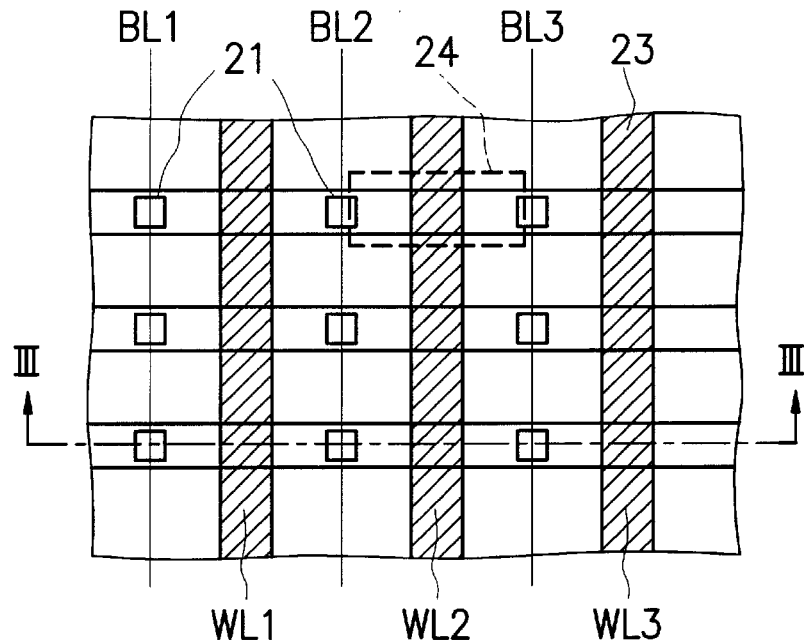
FIG. 2A is a top view of another conventional ROM device.
Figure 2B:
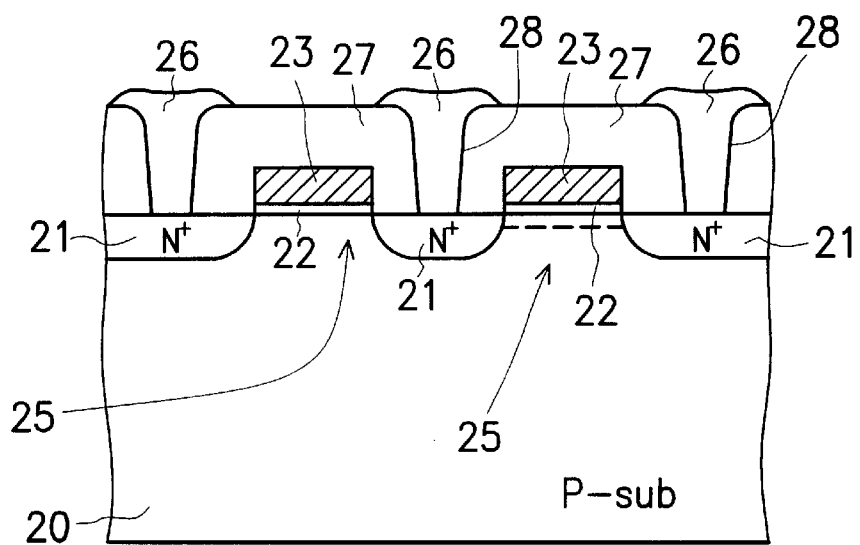
FIG. 2B is a cross-sectional view of the conventional ROM device of FIG. 2A taken along line III–III'.
Figure 3A:
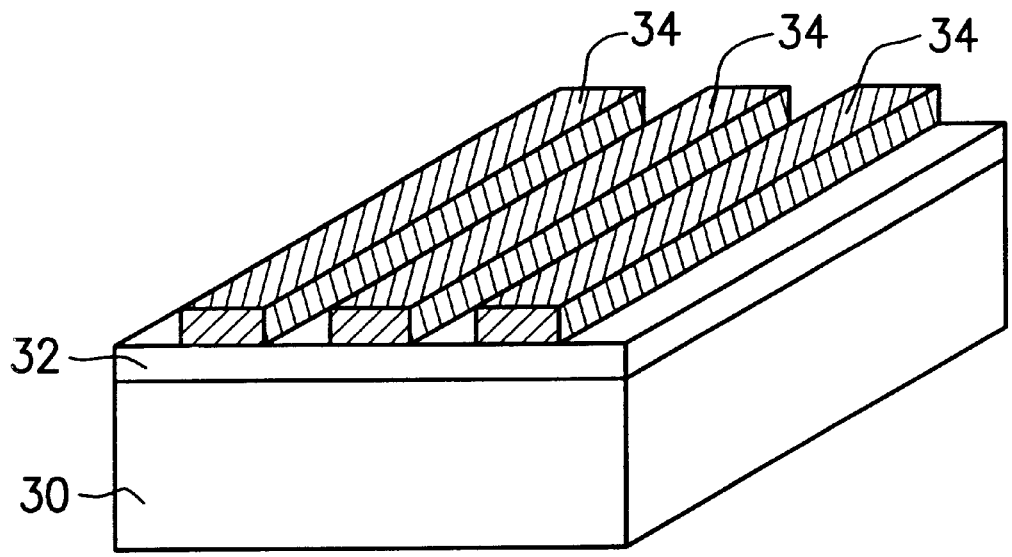
FIGS. 3A through 3F are cross-sectional views showing the steps of the method for making a ROM device having on SOI structure, in accordance with the present invention.

Referring to FIG. 3A, the method of the present invention comprises forming a first insulating layer 32, such as a layer of silicon dioxide or a layer of silicon nitride, over a semiconductor substrate 30, such as a P-type silicon substrate. A plurality of substantially parallel gate regions 34 are formed over the insulating layer 32. Gate regions 34 are formed by depositing a layer of polysilicon over the entire top surface of the device, selectively removing the polysilicon with a photolithographic and an etching process to form a plurality of parallel polysilicon layers, and doping a P-type impurity material into the plurality of polysilicon layers, adjusting the threshold voltage thereof.

Figure 3B:
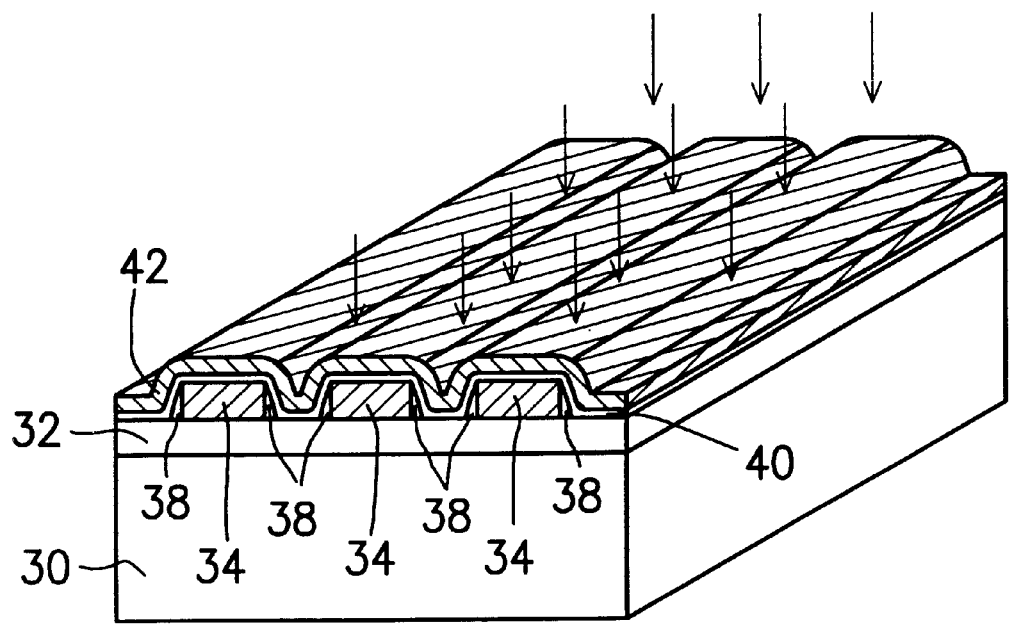

As shown in FIG. 3B, the method further comprises forming a plurality of sidewall spacers 38, wherein each sidewall spacer 38 is formed on a sidewall of each gate region 34. Sidewall spacers 38 are formed by depositing a sidewall insulating layer, such as a layer of silicon dioxide or a layer of silicon nitride, at a predetermined thickness over the device of FIG. 3A, and dry etching the sidewall insulating layer until a top surface of insulating layer 32 is exposed.

As further shown in FIG. 3B, the method comprises the steps of forming a second insulating layer 40, such as a layer of silicon dioxide or a layer of silicon nitride, the entire top surface of the device, and forming a conductive layer 42 having a predetermined thickness over second insulating layer 40. Formation of conductive layer 42 comprises the steps of depositing a polysilicon layer over second insulating layer 40, conducting a rapid thermal anneal (RTA) process on the wafer causing the polysilicon layer to undergo grain growth, and conducting an ion implantation process on the wafer to dope an impurity material into the polysilicon layer, adjusting the threshold voltage thereof. Due to the empty spaces between the gate regions 34, polysilicon conductive layer 42 includes recessed portions.

Figure 3C:
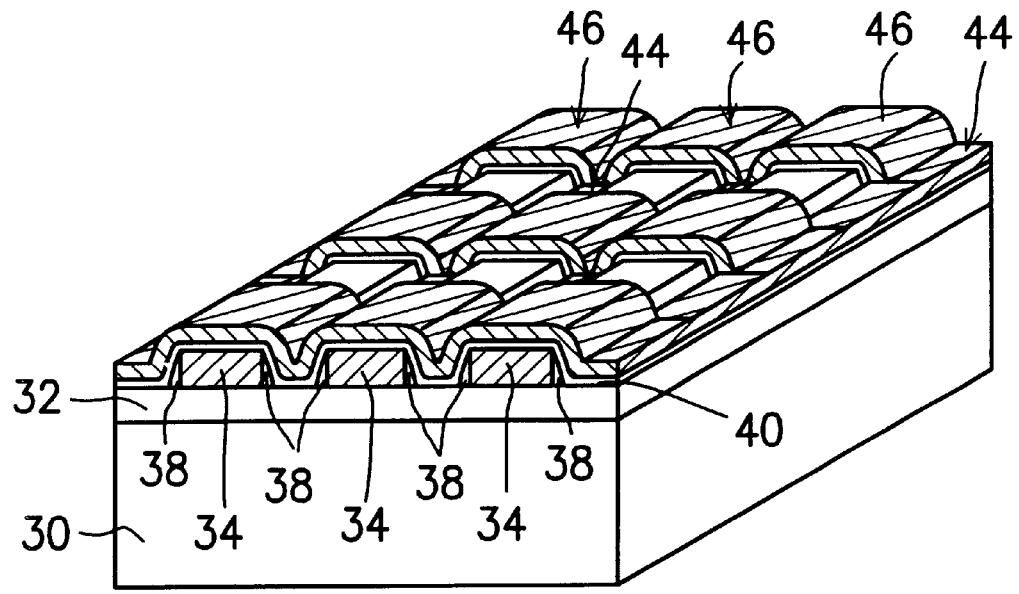

Referring to FIG. 3C, the method of the present invention further comprises a photolithographic and etching process for removing selected portions of polysilicon conductive layer 42 (FIG. 3B) above gate regions 34. The remaining portion of polysilicon conductive layer 42 (FIG. 3B) comprises a grid-like layout, including a plurality of lower portions 44 arranged in a first direction and serving as a plurality of parallel source/drain regions on both sides of gate regions 34, and a plurality of upper portions 46 arranged in a second direction and serving as a plurality of parallel channel regions crossing gate regions 34 at right angles.

Figure 3D:
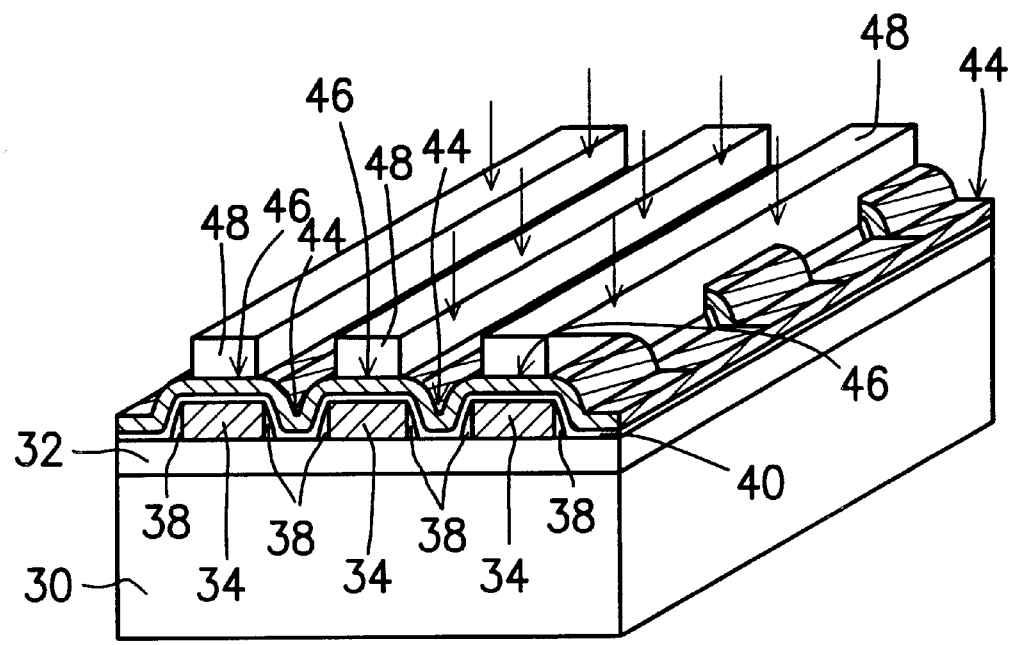

The method, as shown FIG. 3D, also includes the steps of coating a photoresist layer 48 over the device of FIG. 3C, and selectively removing photoresist layer 48 to expose all of source/drain regions 44. Using the photoresist layer 48 as a mask, an ion implantation process dopes an N-type impurity material into polysilicon-based source/drain regions 44, and photoresist layer is subsequently removed. The impurity-doped source/drain regions are hereinafter referred to as N+ source/drain regions but are still labeled with the same reference numeral 44. N+ source/drain regions 44 and channel regions 46 together comprise an array of memory cells to be programmed.

The subsequent processes for writing data into this ROM device and forming interconnecting metallization layers are performed after a customer-supplied binary code is received. These processes are described with reference to the ensuring FIGS. 3E and 3F.

Figure 3E:
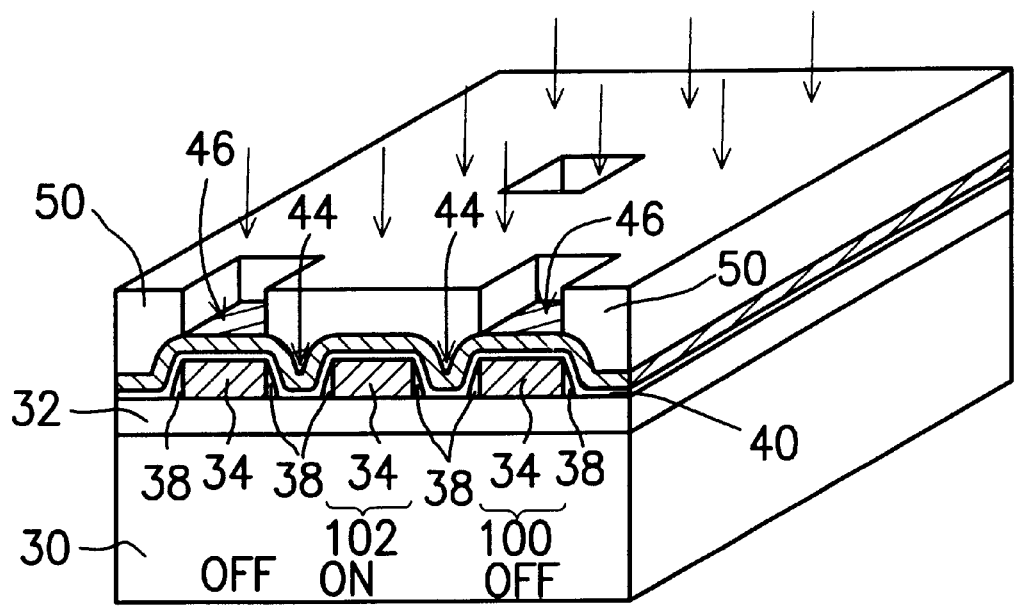

Referring to FIG. 3E, the mask programming process comprises the steps of coating a photoresist layer 50 over the entire top surface of the device, and selectively removing portions of photoresist layer 50 to expose select channel regions 46 associated with a first selected group of the memory cells to be set to a permanently-OFF state. The unexposed group of channel regions 46 are associated with a second selected group of the memory cells to be set to a permanently-ON state. Using the photoresist layer 50 as a mask, an ion implantation process dopes a P-type impurity material into the exposed group of channel regions 46. Subsequently, the entire photoresist layer 50 is removed.

As shown in FIG. 3E, for example, the memory cell that is designated by reference numeral 100 is set to a permanently-OFF state since the associated channel region 46 is exposed through photoresist layer 50, while the memory cell designated by the reference numeral 102 is set to a permanently-ON state since the associated channel region 46 is covered by photoresist layer 50.

Figure 3F:
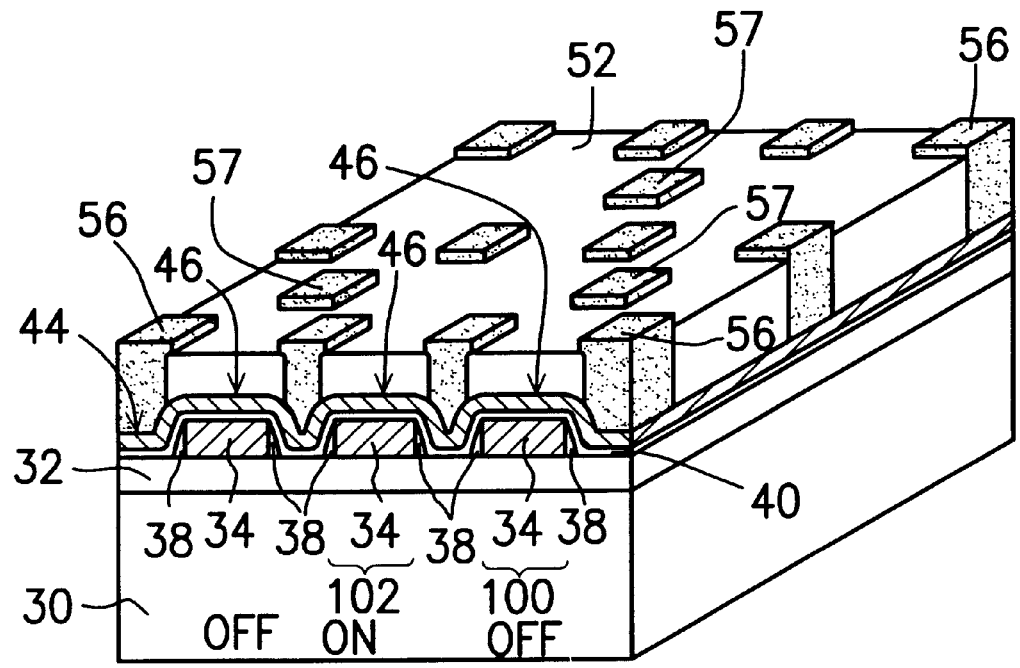
Figure 4:
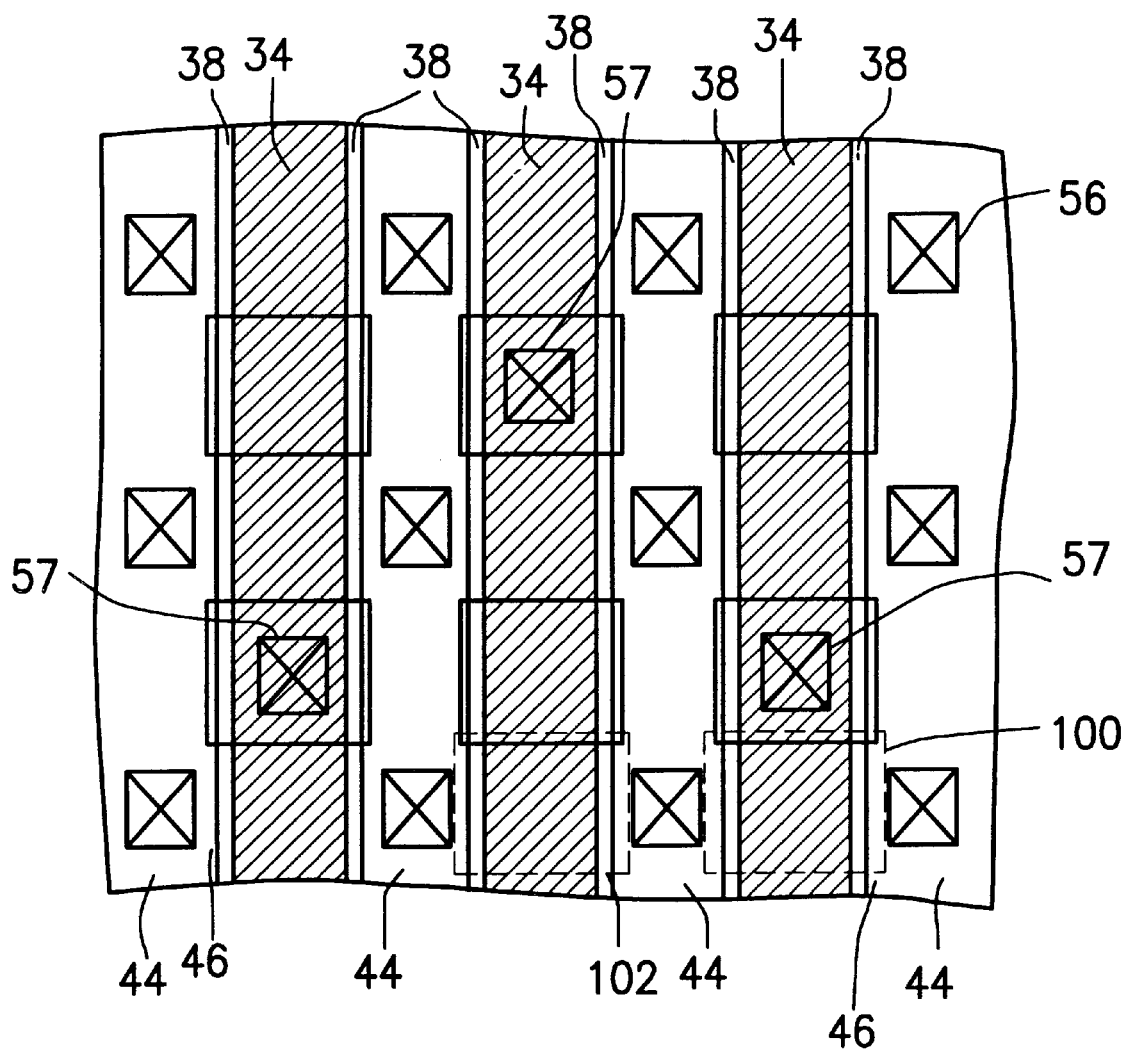
FIG. 4 is a top view of the finished ROM device of FIGS. 3A–3F.

Referring to FIGS. 3F and 4, the programming process further comprises the steps of forming a third insulating layer 52, such as a planar layer of borophosphosilicate glass (BPSG), over the entire top surface of the device; and selectively removing portions of third insulating layer 52 to form a plurality of source/drain contact windows for exposing select N+ source/drain regions 44 associated with the ON-state memory cells, and to form a plurality of gate contact windows for exposing a select gate regions 34 associated with the OFF-state memory cells. The programming process further includes the step of filling a conductive material, such as aluminum, into the contact windows to form a plurality of source/drain electrodes 56 in the source/ drain contact windows and a plurality of gate electrodes 57 in the gate contact windows.

As shown in FIG. 4, for example, the memory cell enclosed in dashed box 100 has a source/drain electrode on either side, and, since this memory cell is set to a permanently-ON state, one gate electrode 57 is formed next to the gate. The memory cell enclosed in dashed box 102 also has source/drain electrode on either side, but since this memory cell is set to a permanently-OFF state, no gate electrode is formed next to the gate.

The remaining processes for making the ROM device include the steps of forming metallization layers interconnecting source/drain electrodes 56 and gate electrodes 57, and all of the required processes for finishing the ROM device known to a skilled artisan. The remaining processes are all conventional in nature and thus, are not within the scope of the present invention. Therefore, the description of these processes are not provided detailed in this specification.

The ROM device made in accordance with the method of the present invention has several advantages over the prior art. First, since an insulating layer, that is, first insulating layer 32, is used to isolate substrate 30 from N+ source/drain regions 44, no leakage current occurs at the junction between the source/drain regions and the substrate. Second, since the mask programming process is performed after the completion of the MOSFET memory cells, reduced delivery time is achieved. Third, since an oxide layer, that is, second insulating layer 40, is formed on the bottom of N+ source/drain regions 44, no leakage path is formed due to misalignment of the contact windows, permitting the ROM device to be made smaller for increased integration.

It will be apparent to those skilled in the art that various modifications and variations can be made in the ROM device of the present invention and in construction of thereof, without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for making a ROM device having an array of MOSFET memory, comprising the steps of:

forming a first insulating layer over a substrate;

forming a first conductive layer over the first insulating layer;

removing selected portions of the first conductive layer to form a plurality of substantially parallel gate regions in a first direction;

forming a plurality of sidewall spacers, each of the sidewall spacers being formed on one sidewall of each of the gate regions;

forming a second insulating layer covering exposed surfaces of the gate regions, the sidewall spacers, and the first insulating layer;

forming a second conductive layer from polysilicon over the second insulating layer;

conducting a thermal anneal process to cause the polysilicon of the second conductive layer to undergo grain growth;

conducting an ion implantation process to dope an impurity material into the polysilicon of the second conductive layer, adjusting the threshold voltage thereof;

removing selected portions of the second conductive layer to form a grid-like structure including a plurality of substantially parallel source/drain regions in the first direction on both sides of the gate regions, and a plurality of substantially parallel channel regions in a second direction, wherein the gate regions, the source/drain regions and the channel regions together comprise a base on which an array of memory cells are defined;

conducting an ion implantation process to dope an impurity material of a first semiconductor type into the source/drain regions;

conducting a mask programming process comprising the steps of:

preparing a mask for exposing select channel regions associated with a first selected group of the memory cells of the ROM device set to a permanently-OFF state, wherein the unexposed group of the channel regions are associated with a second selected group of the memory cells set to a permanently-ON state, and conducting an ion implantation process to dope an impurity material of a second semiconductor type into the exposed group of the channel regions;

forming a third insulating layer over the memory cells;

forming a plurality of source/drain contact windows and a plurality of gate contact windows in the third insulating layer; and filling a conductive material into the source/drain contact windows and the gate contact windows to form a plurality of gate electrodes in the gate contact windows and a plurality of source/drain electrodes in the source/drain contact windows.

2. The method of claim 1, wherein the first semiconductor type is a P-type and the second semiconductor type is a N-type.

3. The method of claim 1, wherein the first semiconductor type is a N-type while the second semiconductor type is a P-type.

4. The method of claim 1, wherein the first insulating layer comprises silicon dioxide.

5. The method of claim 1, wherein the first insulating layer comprises silicon nitride.

6. The method of claim 1, wherein the first conductive layer comprises impurity-doped polysilicon.

7. The method of claim 1, wherein the sidewall spacers comprise silicon dioxide.

8. The method of claim 1, wherein the sidewall spacers comprise silicon nitride.

9. The method of claim 1, wherein the second insulating layer comprises silicon nitride.

10. The method of claim 1, wherein the second insulating layer comprises silicon dioxide.

11. The method of claim 1, wherein the second conductive layer comprises polysilicon.

12. The method of claim 1, wherein the thermal anneal process is an RTA process.

13. The method of claim 1, wherein the second direction is substantially perpendicular to the first direction.

14. The method of claim 1, wherein the third insulating layer comprises BPSG.

15. The method of claim 1, wherein the third conductive layer comprises a metallization layer.

* * * * *